United States Patent
Lee et al.

[11] Patent Number: 5,872,372
[45] Date of Patent: Feb. 16, 1999

[54] THIN FILM TRANSISTOR WITH PIEZOELECTRIC FILM

[75] Inventors: Seong-Jae Lee, Seoul; Kyoung-Wan Park; Min-Cheol Shin, both of Daejeon, all of Rep. of Korea

[73] Assignee: Electronics and Telecommunications Research Institute, Daejeon, Rep. of Korea

[21] Appl. No.: 712,410

[22] Filed: Sep. 11, 1996

[30] Foreign Application Priority Data

Dec. 8, 1995 [KR] Rep. of Korea .................. 95-47863

[51] Int. Cl.⁶ .................................................. H01L 29/82
[52] U.S. Cl. ..................... 257/254; 257/364; 257/410; 257/411; 257/415; 257/417
[58] Field of Search ............................. 257/410, 411, 257/364, 310, 379, 254, 415, 417

[56] References Cited

U.S. PATENT DOCUMENTS

| | | | |
|---|---|---|---|
| 3,585,415 | 6/1971 | Muller | 310/319 |
| 3,903,406 | 9/1975 | London | 235/181 |
| 4,480,488 | 11/1984 | Read et al. | 73/862.68 |
| 4,499,515 | 2/1985 | Piotrowski et al. | 360/113 |
| 4,665,374 | 5/1987 | Fathimulla | 333/196 |
| 5,115,292 | 5/1992 | Takebe et al. | 357/26 |
| 5,279,162 | 1/1994 | Takebe et al. | 73/726 |
| 5,663,507 | 9/1997 | Westervelt et al. | 73/727 |

*Primary Examiner*—William Mintel
*Attorney, Agent, or Firm*—Nixon & Vanderhye P.C.

[57] ABSTRACT

A thin film transistor is disclosed comprising a piezoelectric film formed on a piezoresistive body of an ultra thin film and a gate electrode formed on the piezoelectric film. Due to the force generated from the piezoelectric film by an electric field generated according to the strength of a voltage applied to the gate electrode, a pressure is applied on the piezoresistive body to vary the resistance of the piezoresistive body. Thus, the quantity of current that flows from a source terminal through the piezoresistive channel to a drain terminal can be controlled. Since the piezoresistive body can be formed on a plane, a thin film transistor with a three-dimensional structure can be manufactured.

10 Claims, 2 Drawing Sheets

5,872,372

THIN FILM TRANSISTOR WITH PIEZOELECTRIC FILM

BACKGROUND OF THE INVENTION

The present invention relates to a thin film transistor, and more particularly, to a thin film transistor in which an ultra thin film piezoresistive body is formed as a channel layer, and a method of manufacturing thereof.

In general, in a MOS-type transistor, a channel layer as a passage of a current flow from a source electrode to a drain electrode is formed of a semiconductor material.

When an electric field is applied to the channel layer by the gate voltage, the concentration of electrons or holes in the channel serving as carriers varies according to the gate voltage to result in a change of the conductance of the channel.

In other words, in the aforementioned MOS-type transistor, the transistor performs a switching or an amplifying action according to the strength of the voltage applied to the gate electrode.

However, since the channel layer is formed of a semiconductor material in the MOS-type transistor, a process of forming the device is complicated. That is, a plurality of unit processes such as a process of implanting an impurity, a process of forming a mask pattern for impurity implantation et. al. should be carried out.

SUMMARY OF THE INVENTION

The present invention provides a transistor utilizing a Mo—C ultra thin film, and particularly, a transistor having a structure in which a piezoelectric material is inserted with a shape of a thin film between a gate electrode and a Mo—C ultra thin film of a piezoresistive body and both ends of the Mo—C ultra thin film are used as source and drain terminals, so that the Mo—C thin film serves as the channel layer of the transistor according to the conventional method.

Objects of the present invention utilizing the above piezoresistive body and the piezoelectric film are as follows.

It is a first object to provide a thin film transistor with a structure in which the piezoelectric film is formed between the piezoresistive body and the gate electrode.

It is a second object to provide a method of manufacturing the thin film transistor according to the first object of the present invention.

It is a third object to provide a thin film transistor with a structure in which the piezoresistive body with a predetermined width is buried in the middle region of the bottom of the piezoelectric film, and a first gate electrode and a second gate electrode are formed on the upper surface of the piezoelectric film at positions corresponding to both ends of the piezoresistive body in a vertical direction, respectively.

It is a fourth object to provide a method of manufacturing the thin film transistor according to the third object of the present invention.

To accomplish the first object of the present invention, according to a first embodiment of the present invention, there is provided a thin film transistor comprising a substrate; a Mo—C piezoresistive body formed on the substrate; a piezoelectric film formed on the middle region of the piezoresistive body to apply a pressure on the piezoresistive material; and a gate electrode formed on the piezoelectric film.

To accomplish the second object of the present invention, there is provided a method of manufacturing a thin film transistor, comprising the steps of depositing and patterning a Mo—C ultra thin film on a substrate by using a Mo—C target to form a piezoresistive body; sequentially depositing a piezoelectric material with a piezoelectric characteristic and a conductive metal on the entire surface of the substrate and the piezoresistive body; and sequentially etching the piezoelectric material and the conductive metal to form a piezoelectric film and a gate electrode on the middle region of the piezoresistive body.

To accomplish the third object of the present invention, according to a second embodiment of the present invention, there is provided a thin film transistor comprising a substrate; a Mo—C piezoresistive body formed to predetermined width and thickness on the substrate and buried under the bottom of the piezoelectric film; and a first gate electrode and a second gate electrode formed on the upper surface of the piezoelectric film at positions corresponding to both ends of the piezoresistive body in a vertical direction, respectively.

To accomplish the fourth object of the present invention, there is provided a method of manufacturing a thin film transistor, comprising the steps of depositing and patterning a Mo—C on a substrate by using a Mo—C target to form a piezoresistive body; depositing a piezoelectric material with a piezoelectric characteristic on the entire surface of the substrate and the piezoresistive body and patterning it to cover the entire surface of the piezoresistive body; and depositing a conductive metal on the entire surface of the substrate and the piezoelectric film and patterning it to form a first gate electrode 26a and a second gate electrode 26b at positions corresponding to both ends of the piezoresistive body in a vertical direction.

Brief Description of the Attached Drawings

Detailed Description of the Invention

Hereinafter, embodiments of the present invention will be described, in more detail, with reference to the attached drawings.

A piezoelectric material utilized in the present invention is a material generating a voltage in proportion to a mechanical force applied thereto, or on the contrary, a material generating a mechanical force when a voltage is applied thereto.

In other words, the piezoelectric device plays a role of varying the mechanical force electrically. As the piezoelectric material, there are insulators such as a quartz, a $LiNbO_3$, a $BaTiO_3$ and a $PbTiO_3$, or semiconductor materials such as a ZnS and an InSb.

With a piezoresistive material, the piezoelectric material utilized in the present invention serves as the material of the transistor for amplifying an electric signal and changing it into another electric signal, instead of changing the mechanical force into the electric signal.

Here, the piezoresistive material is a material that the electric resistance thereof itself is varied when the mechanical force (pressure) is applied thereto.

A Mo—C ultra thin film formed as the piezoresistive body can be easily formed on a semiconductor like silicon or an arbitrary insulating film, by a sputtering deposition method. It has a conductive characteristic that electricity is conducted even in an ultra thin film of about 0.15 nm.

The excellent piezoresistive phenomenon of the Mo—C ultra thin film is caused by a extremely thin thickness of a metal thin film, i.e., 0.15 to 5 nm. It is a material showing a very peculiar characteristic, among various metallic compounds.

When the mechanical force is applied to the ultra thin film, the force received by an unit atom becomes larger, because there are few atoms available to sustain the structure of the film. Thus, the distance between atoms is easily changed to vary the resistance of the ultra thin film.

For example, in a case that the thickness of the metal thin film is extremely thin, the length thereof extends easily even by small pressurizing force, thereby increasing the electric resistance of the thin film.

However, even in a case that the above metallic thin film has an extremely thin thickness, e.g., a thickness of about 0.15 nm (a degree of a single atomic layer), it is conducted electrically.

Figure 1:
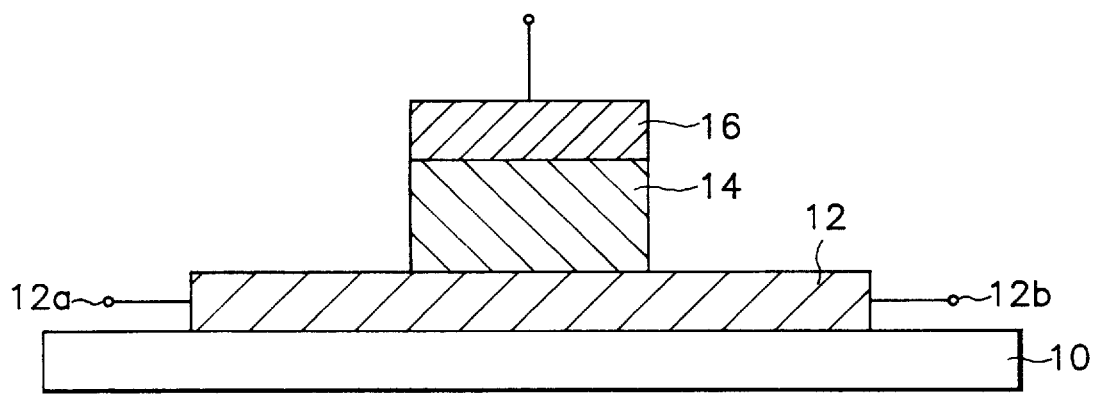
FIG. 1 is a cross-sectional view showing the structure of a transistor according to a first embodiment of the present invention.

FIG. 1 is a cross-sectional view showing the structure of a transistor according to a first embodiment of the present invention.

The transistor according to the first embodiment of the present invention has a structure in which a piezoelectric film 14 is formed to a predetermined size on the middle region of a piezoresistive body 12 consisting of a Mo—C with a thickness of 0.15 nm to 5 nm, and a gate electrode 16 is formed on the surface of piezoelectric film 14.

At this time, the Mo—C as piezoresistive body 12 is formed on the substrate either by directly sputtering a Mo—C target or by the reactive sputtering of MO target with an acetylene gas or a methane gas.

Piezoresistive body 12 is formed under conditions of a temperature of 500° C, a mol ratio of Mo versus C in a range of 1:3 to 3:1, and a thickness of 0.5 to 5 nm.

Then, piezoresistive body 12 is patterned by a photoetching process to form a pattern with a predetermined size.

Then, on the surface of piezoresistive body 12, a piezoelectric film 14 is formed of an insulating material such as a quartz, a $LiNbO_3$, a $BaTiO_3$ and a $PbTiO_3$, or a semiconductor material such as a ZnS and an InSb.

In the Mo—C ultra thin film transistor according to the present invention manufactured with the aforementioned structure and materials, when a voltage is applied to gate electrode 16, an electric field is applied to piezoelectric film 14. Force is generated from piezoelectric film 14 according to the strength of the applied voltage, thereby transmitting the force to piezoresistive body 12 located to be in contact with the lower part of piezoelectric film 14.

Therefore, the distance between atoms of piezoresistive body 12 changes accordingly, thereby varying the resistance thereof itself.

When a voltage is applied between a source electrode and a drain electrode, the quantity of current that flows through piezoresistive body 12 is affected.

In other words, in the ultra thin film transistor according to the first embodiment of the present invention, the strength of the voltage applied to the gate electrode is controlled, so that the pressure generated by the electric field applied to the piezoelectric film acts on the Mo—C ultra thin film in a vertical direction, thereby varying the resistance of the piezoresistive body consisting of the Mo—C ultra thin film. Thus, the quantity of current that flows through source and drain terminals 12a and 12b can be controlled.

Accordingly, the thin film transistor of the present invention can performs a switching function as if the MOS-type transistor of the conventional method.

Figure 2:
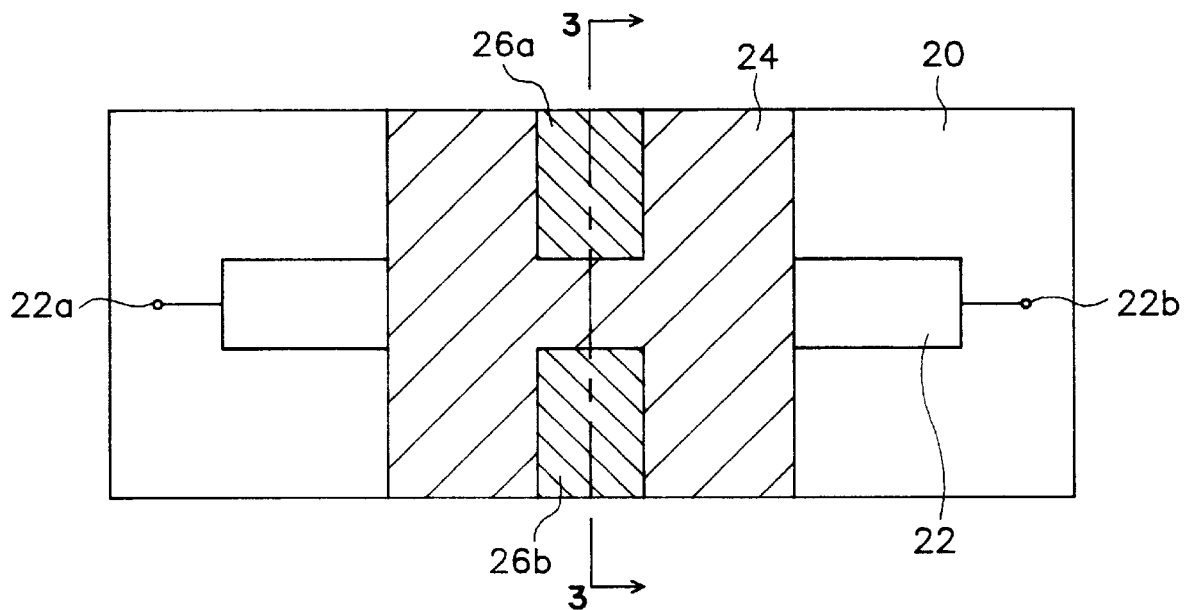
FIG. 2 is a plan view of a Mo—C ultra thin film transistor according to a second embodiment of the present invention.
Figure 3:
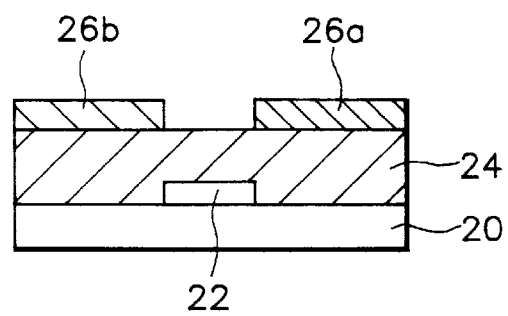
FIG. 3 is a cross-sectional view taken along line A–A' in FIG. 2.

FIG. 2 is a plan view of a Mo—C ultra thin film transistor according to a second embodiment of the present invention. FIG. 3 is a cross-sectional view taken along line A–A' in FIG. 2.

In the Mo—C ultra thin film transistor according to the second embodiment of the present invention, as shown in FIG. 3, a Mo—C piezoresistive body 22 with the predetermined size and thickness is formed in the middle region of the bottom of piezoelectric film 24 formed of an insulating or semiconductor material on an insulating substrate 20. On the upper surface of piezoelectric film 24, a first gate electrode 26a and a second gate electrode 26b with a predetermined size are formed at positions corresponding to both ends of piezoresistive body 22 in a vertical direction.

In the Mo—C ultra thin film transistor with the aforementioned structure according to the second embodiment of the present invention, a Mo—C film is deposited either by directly sputtering a Mo—C target or by the reactive sputtering of a Mo target with a acetylene or methane gas.

At this time, the Mo—C ultra thin film is formed under a condition that a temperature is 500° C. and the range of the mol ratio of Mo and C is 1:3 to 3:1, and has a thickness of 0.5 to 5 nm.

Then, through a photo-etching process, the Mo—C ultra thin film is patterned so as to have a predetermined size, thereby defining a piezoresistive body 22.

Thereafter, on the entire surface, an insulating material such as a quartz, a $LiNbO_3$, a $BaTiO_3$ and a $PbTiO_3$, or a semiconductor material such as a ZnS and an InSb is deposited to form a piezoelectric film 24.

Then, a conductive metal is deposited to form a first gate electrode 26a and a second gate electrode 26b by an appropriate lithography technique with a predetermined size on the surface of piezoelectric film 24 corresponding to both ends of piezoresistive body 22 in a vertical direction, respectively. As a result, the thin film transistor is manufactured.

As compared to the first embodiment of the present invention, the ultra thin film transistor with the above structure according to the second embodiment of the present invention is different structurally. However, the forming material is the same, and the principle that the quantity of current being flow through source terminal 22 and drain terminal 22b of the transistor is controlled using the piezoelectric effect and the piezoresistive effect is the same.

In the first embodiment, the transistor acts to control the quantity of current that flows from source terminal 12a to drain terminal 12b by the pressure that acts on piezoresistive body 14 in a vertical direction according to the voltage applied to gate electrode 16.

On the contrary, in the ultra thin film transistor according to the second embodiment of the present invention, with the voltage applied to first gate electrode 26a and second gate electrode 26b, the electric field is generated between the two electrodes. Due to this electric field, force of a horizontal direction is generated from piezoelectric film 24, thereby transmitting the force of horizontal direction from piezoelectric film 24 to piezoresistive body 22 of the ultra thin film consisting of the Mo—C.

Accordingly, the distance between atoms of piezoresistive body 22 is changed to vary the resistance of piezoresistive body 22. Thus, the quantity of current that flows from the source terminal to the drain terminal through piezoresistive body 22 is varied.

That is, in the thin film transistor according to the second embodiment of the present invention, first gate electrode 26a and second gate electrode 26b which are spaced apart from each other by a predetermined distance are formed on the upper surface of piezoelectric film 24. Therefore, when voltages are applied to all electrodes of the transistor, the resistance of piezoresistive body 22 is varied according to the pressure applied by piezoelectric film 24, corresponding to the strength of the voltage applied to first gate electrode 26a and second gate electrode 26b. Thus, the quantity of current that flows from the source terminal to the drain terminal through piezoresistive body 22 can be controlled.

Accordingly, as if the conventional semiconductor transistor, the strength of the voltage applied to gate electrodes 26a and 26b is adjusted to control the quantity of current generated to the side of the drain terminal.

According to the present invention, the transistor comprising the piezoresistive body corresponding to the channel layer of the transistor, the piezoelectric film corresponding to the gate insulating film, and the gate electrode, can control the source-drain of the transistor by the force of a vertical or a horizontal direction, which is generated according to the strength of the voltage applied to the gate electrode.

Therefore, according to the transistor of the present invention as described above, it is possible to manufacture a transistor without using a semiconductor layer. Further, since the transistor can be formed on a substrate or any insulating film and semiconductor film, it is possible to manufacture a transistor with a three-dimensional structure. In addition, it is manufactured by a more simplified process, as compared to the conventional manufacturing method of a transistor.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:
1. A thin film transistor comprising:
   a substrate;
   a thin metallic film serving as a piezoresistive body formed on said substrate;
   a piezoelectric film formed on said piezoresistive body to apply a pressure to said piezoresistive material; and
   a gate electrode formed on said piezoelectric film.
2. A thin film transistor as in claim 1, wherein both ends of said piezoresistive body serve as a source terminal and a drain terminal.
3. A thin film transistor as in claim 1, wherein said piezoresistive body is composed of a Mo—C film having a thickness of 0.15 to 5 nm.
4. A thin film transistor as in claim 3 wherein said Mo—C has a mol ratio of the Mo and C in a range of 1:3 to 3:1.
5. A thin film transistor as in claim 1, wherein said piezoelectric film is formed of material selected from at least one of: quartz, $LiNbO_3$, $BaTiO_3$, $PbTiO_3$, ZnS and InSb.
6. A thin film transistor comprising:
   a substrate;
   a thin metallic film serving as a piezoresistive body formed to predetermined size and thickness on said substrate and buried under the bottom of a piezoelectric film; and
   a first gate electrode and a second gate electrode formed on the upper surface of said piezoelectric film at positions corresponding to both ends of said piezoresistive body in a vertical direction, respectively.
7. A thin film transistor as in claim 6, wherein both ends of said piezoresistive body serve as a source terminal and a drain terminal.
8. A thin film transistor as in claim 6, wherein said piezoresistive body is composed of a Mo—C film having a thickness of 0.15 to 5 nm.
9. A thin film transistor as in claim 8 wherein said Mo—C has a mol ratio of the Mo and C in a range of 1:3 to 3:1.
10. A thin film transistor as in claim 6 wherein said piezoelectric film is formed of a material selected from at least one of: quartz, $LiNbO_3$, $BaTiO_3$, $PbTiO_3$, ZnS and InSb.

* * * * *